(12) United States Patent
Kumar et al.

(10) Patent No.: US 10,679,694 B2
(45) Date of Patent: Jun. 9, 2020

(54) PERFORMANCE AWARE WORD LINE UNDER-DRIVE READ ASSIST SCHEME FOR HIGH DENSITY SRAM TO ENABLE LOW VOLTAGE FUNCTIONALITY

(71) Applicant: Synopsys, Inc., Mountain View, CA (US)

(72) Inventors: Vinay Kumar, Aligarh (IN); Ravindra Kumar Shrivastava, Noida (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/241,349

(22) Filed: Jan. 7, 2019

(65) Prior Publication Data
US 2019/0221256 A1    Jul. 18, 2019

(30) Foreign Application Priority Data
Jan. 15, 2018 (IN) .............................. 201811001688

(51) Int. Cl.
*G11C 11/419* (2006.01)
*H01L 27/11* (2006.01)
(Continued)

(52) U.S. Cl.
CPC .......... *G11C 11/419* (2013.01); *G11C 11/418* (2013.01); *H01L 27/1104* (2013.01); *G11C 7/04* (2013.01); *G11C 8/08* (2013.01)

(58) Field of Classification Search
CPC ..... G11C 11/41; G11C 11/411; G11C 11/412; G11C 11/419; G11C 11/416; G11C 11/418; G11C 11/413; G11C 7/04; G11C 8/00
(Continued)

(56) References Cited

U.S. PATENT DOCUMENTS 7,974,146 B2    7/2011 Barkley
9,865,333 B2    1/2018 Dhori et al.
(Continued)

OTHER PUBLICATIONS

Abu-Rahma, M.H. et al., Nanometer Variation-Tolerant SRAM, Chapter 3 entitled "Variation-Tolerant SRAM Write and Read Assist Techniques", pp. 49-95 (47 pages), 2013.
(Continued)

*Primary Examiner* — Alfredo Bermudez Lozada
(74) *Attorney, Agent, or Firm* — Bever, Hoffman & Harms, LLP (57) ABSTRACT

PMOS-based temperature compensated read-assist circuits for low-Vmin 6T SRAM bitcells realized in nanometer scale (e.g., 7 nm) CMOS FinFET technologies generate maximum wordline lowering (lower wordline voltages) at higher temperatures and minimum wordline lowering (higher wordline voltages) at lower operating temperatures in way that is substantially process independent and avoids post-silicon tuning. A read-assist PMOS transistor is connected between an associated wordline and VSS and controlled by a temperature compensation signal produced at an intermediate node between weak pull-up and strong pull-down PMOS transistors that are connected in series between VDD and VSS and respectively controlled by VDD and VSS during read operations. This configuration generates the temperature compensation signal at a level closer to VSS at high temperatures than at low temperatures, whereby write-ability is not impacted by the read-assist circuit at low temperature. An optional actuation circuit disables the temperature compensation circuit during non-active cycles to prevent current leakage.

11 Claims, 6 Drawing Sheets

(51) Int. Cl.
   *G11C 11/418*   (2006.01)
   *G11C 7/04*     (2006.01)
   *G11C 8/08*     (2006.01)

(58) Field of Classification Search
   USPC .............................. 365/154, 189.011, 189.15
   See application file for complete search history.

(56) References Cited

U.S. PATENT DOCUMENTS

| | | | |
|---|---|---|---|
| 9,997,236 B1* | 6/2018 | Pathak | G11C 11/419 |
| 10,014,049 B2 | 7/2018 | Walker | |
| 2019/0066772 A1* | 2/2019 | Singh | G11C 11/418 |

OTHER PUBLICATIONS

Chuang, Ching-Te et al.,"High-Performance SRAM in Nanoscale CMOS: Design Challenges and Techniques", IEEE 978-1-4244-1656-1/07, 2007, 8 pages.

Keshavarapu, Santhosh et al., 2012 Int'l. Symposium on Electronic System Design, article entitled "A New Assist Technique to Enhance the Read and Write Margins of Low Voltage SRAM cell", IEEE 978-0-7695-4902-6/12.

Khan, Seyab et al., articles entitled "Bias temperature Instability analysis of FinFET based SRAM cells", 978-3-9815370-2/4 2014, EDAA.

Pulla Reddy, A., et al., article entitled "Write and Read Assist Techniques for SRAM Memories in Nanometer Technology", Materials Today: Proceedings 4 (2017) 10309-10314, 6 pages.

Sharma, V., et al., SRAM Design for Wireless Sensor Networks, Analog Circuits and Signal Processing, Chapter 4 entitled "Circuit Techniques to Assist SRAM Cell", pp. 67-94 (28 pages), 2013.

Yadav, Nandakishor et al., article entitled "NBTI Aware IG-FinFET based SRAM Design using Adaptable Trip-Point Sensing Technique", 978-1-4799-6384-3/14 1EEE, 2014, 7 pages.

Zordan, L.B., et al., article entitled "On the Reuse of Read and Write Assist Circuits to Improve Test Efficiency in Low-Power SRAMs", Paper 14.2 Int'l. Test Conf., 978-1-4799-0859-2/13, IEEE, 2013, 10 pages.

* cited by examiner

| WL LOWERING AMOUNT (mV) -- VDDA = 550mV AND TEMP = 125C | | | | |
|---|---|---|---|---|
| IMPLEMENTATION | SS/125 | SF/125 | FS/125 | FF/125 |
| CONVENTIONAL | 38 | 42 | 39 | 39 |
| USING 160A | 36 | 44 | 38 | 44 |

FIG. 4

| WL LOWERING AMOUNT (mV) -- VDDA = 550mV AND TEMP = -40C | | | | |
|---|---|---|---|---|
| IMPLEMENTATION | SS/-40 | SF/-40 | FS/-40 | FF/-40 |
| CONVENTIONAL | 29 | 30 | 30 | 34 |
| USING 160A | 7 | 10 | 7 | 12 |

| ICELL (Read Current) Comparison for Weak Bitcell @ Voltage=0.550v | | | | |
|---|---|---|---|---|
| Read Assist Scheme | SS/-40(uA) | SS/125(uA) | WL lowered @ SS/-40 | WL lowered @ SS/125 |
| conventional RA | 280 | 2067 | ~40mv | ~40mv |
| Proposed Temp compensated RA | 605 | 2041 | ~7mv | ~40mv |
| ** Performance Limited by ICELL @ SS/-40 | | | | |

PERFORMANCE AWARE WORD LINE UNDER-DRIVE READ ASSIST SCHEME FOR HIGH DENSITY SRAM TO ENABLE LOW VOLTAGE FUNCTIONALITY

RELATED APPLICATIONS

This application claims priority from Indian Provisional patent application serial number 201811001688 entitled "A TEMPERATURE COMPENSATED READ ASSIST FOR LOW VMIN AND HIGH PERFORMANCE HIGH DENSITY 6T SRAM IN FINFET TECHNOLOGY", which was filed on Jan. 15, 2018, and is incorporated by reference herein.

FIELD OF THE INVENTION

This invention relates to integrated memory circuits and in particular to read-assist circuits for a static random-access memory (SRAM).

BACKGROUND OF THE INVENTION

High-density (HD) six-transistor (6T) single-fin FinFET SRAM bitcells that are fabricated using nanometer-scale CMOS fabrication technologies provide significant size and performance advantages over other SRAM bitcells formed using the same technologies. For example, HD 6T FinFET SRAM bitcells exhibit a 20-25% better bitcell area efficiency and lower leakage in comparison to High Performance (HP) SRAM bitcells, and exhibit 40-50% leakage advantage as compared to High Current (HC) SRAM bitcells. Accordingly, HD 6T FinFET SRAM arrays are currently preferred for use in current integrated circuit (IC) devices.

Figure 9:
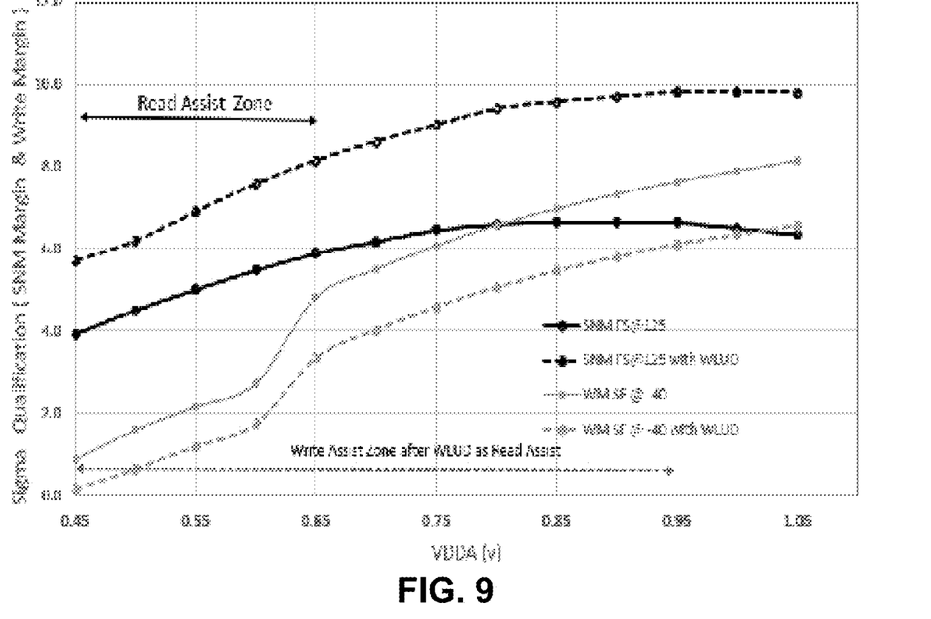
FIG. 9 is a table showing signal noise margin and write margin characteristics of 7 nm FinFET High Density SRAM bitcells as a function of operating voltage.

Memory assist circuitry (i.e., read-assist circuitry and/or write-assist circuitry) is typically utilized in HD SRAM arrays to address various read-ability and write-ability issues that arise in IC devices fabricated using nanometer scale fabrication technologies. For example, process variations that occur in nanometer scale fabrication technologies can cause the strength of the NMOS pull-up transistors used in 6T SRAM configurations to be much stronger than the strength of the PMOS pull-down transistors. As indicated by the table shown in FIG. 9, HD SRAM arrays including 7 nm FinFET High Density SRAM bitcells and operated at lower system voltages (i.e., below about 0.75V) exhibit stronger-NMOS/weaker-PMOS issues that can significantly degrade the bitcells' signal noise margin (SNM). Degradation of the write margin causes serious write-ability issues (i.e., the ability to accurately store "1" and "0" data bit values on HD 6T SRAM bitcells during write operations). Large Random variation on silicon also exhibit possibility of strong PMOS and weaker NMOS (SF Corner) that cause Degradation of the write margin and creates serious write-ability issues (i.e., the ability to accurately write "1" and "0" data bit values on HD 6T SRAM bitcells during write operations). To address write-ability issues, these HD SRAM arrays include write-assist circuitry configured to implement a suitable write-assist technique, such as lowering bitcell supply voltages, wordline boosting, negative bitline write, or implementing a body bias to improve the strength of NMOS pass-gate transistors relative to the strength of PMOS pull-up transistors. In addition, process variations and operating temperature variations can create an unacceptable SNM at lower voltages, which affects the read-ability of HD 6T SRAM bitcells (i.e., the ability to distinguish between "1" and "0" data bit values stored on the HD 6T SRAM bitcells during read operations). To address such read-ability issues, HD SRAM arrays include read-assist circuitry configured to implement a suitable read-assist technique such as using wordline lowering (also known as wordline under-drive (WLUD)), using higher bitcell supply voltages, using lower bitline capacitance, or modulating device characteristics using body bias.

Figure 10A:
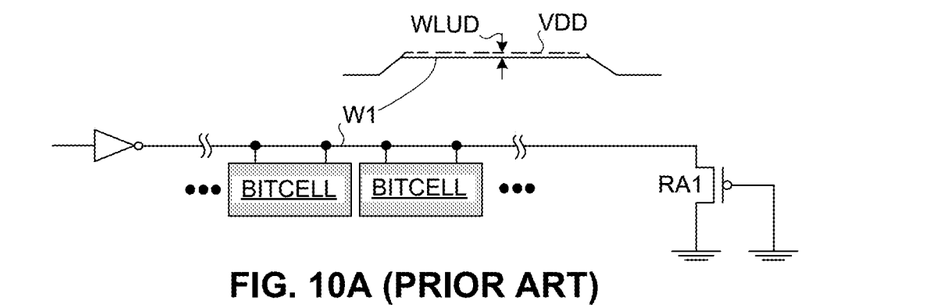
FIGS. 10A and 10B are simplified circuit diagrams depicting conventional wordline lowering techniques.
Figure 10B:
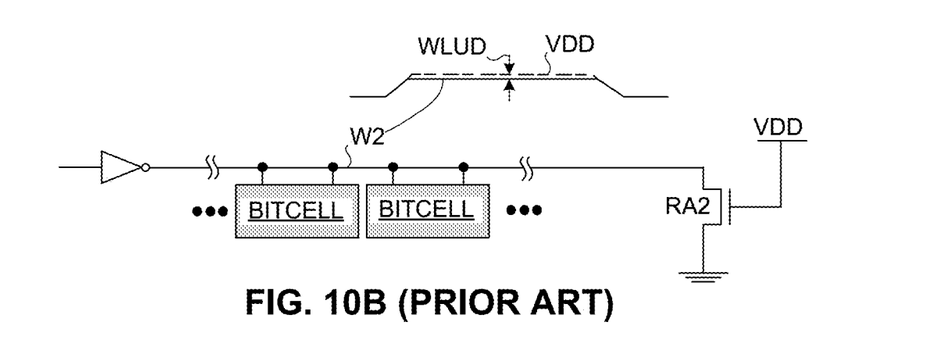

The most commonly used read-assist technique utilized in HD SRAM FinFET arrays is wordline lowering (WLUD), where the asserted (high) voltage transmitted on a selected wordline (WL) of an HD SRAM array is pulled down (decreased or "lowered") by the read-assist circuit to a WLUD voltage level that is lower than the SRAM array's high supply voltage (e.g., VDD). Lowering the voltage on a wordline when reading data from a 6T SRAM bitcell controlled by that wordline decreases the bitcell's pass-gate strength, which improves the read stability. FIGS. 10A and 10B include simplified diagrams depicting two conventional wordline lowering circuits, with the circuit shown in FIG. 10A using a PMOS read-assist transistor RA1 connected between an associated wordline W1 and system low voltage (ground) and controlled by way of connection to ground, and the circuit shown in FIG. 10B using a NMOS read-assist transistor RA2 connected between an associated wordline W2 and ground and controlled by a high supply voltage VDD. Each of these conventional read-assist circuits create a weaker current path through read assist transistors RA1 and RA2 that reduce (lower) the voltage level on wordlines W1 and W2 below the supply voltage level VDD during active read operations (i.e., when wordlines V1 and V2 are driven high by associated control circuitry). These wordline lowering read-assist approaches are often used during both read and write operations such that half-selected bitcells experience lower wordline voltages. However, lowering the wordline voltage during write operations degrades the write margin, so a write assist technique is usually implemented along with the wordline lowering technique approach.

Although the amount of wordline lowering produced by the conventional read-assist circuits shown in FIGS. 10A and 10B generates beneficially improved SNM during HD SRAM array read operations at higher operating temperatures, they are problematic at lower operating temperatures and Slow NMOS and Slow PMOS process (SS Corners), with operating frequency of SRAM Memory limited by performance achieved at SS/−40° C. That is, for ideal read assist schemes, the amount of wordline lowering (i.e., the "underdrive" or WLUD amount) is varied depending on process and temperature conditions, i.e., such that the lowest wordline voltage (highest amount of wordline lowering) occurs in the worst global corner for read stability (i.e., fast NMOS and slow PMOS, or "FS"), which occur at high operating temperatures, while the wordline voltage is maintained at a high level (i.e., lowest amount of wordline lowering) in other corners which are write-limited, which occur at lower operating temperatures. In conventional word line underdrive schemes (FIGS. 10A and 10B), the underdrive amounts at SS/−40° C. and SF/−40° C. corners are almost comparable to what is designed for FS/125° C. corners. This puts a performance penalty on memory. Considering similar degradation using these conventional wordline lowering schemes, cell current would have been reduced to one fourth, resulting into severe penalty on operating frequency and access time in the host SRAM array. That is, because SNM varies with process, voltage and temperature, it is important for a given read-assist circuit to vary the WLUD voltage such that wordline lowering is maximized at higher operating temperatures and minimized at lower operating temperatures. The conventional approaches depicted in FIGS. 10A and 10B fail to provide the needed temperature compensation.

Recently, temperature-compensated read-assist circuits have been proposed (e.g., as taught in U.S. Pat. No. 9,997,236) that utilize a NMOS read-assist transistor connected to each word line, temperature compensation circuitry configured to vary the gate voltage applied to the NMOS read-assist transistor such that more significant word line lowering occurs at higher temperatures than at lower temperatures. Typically, the process for SRAM (Bitcell) and Periphery (i.e., control circuity+Word line PMOS+Read circuit assist circuitry) are not aligned. In low nodes as fabrication mask for SRAM and logic are not same (e.g., SRAM bitcell might have faster PMOS and slow NMOS while word line and read assist schemes might have Slower NMOS and faster PMOS, and vice versa). In misaligned variation across SRAM and periphery process, lowering word line though NMOS is not a robust scheme and will lower yield finally increasing SOC cost.

What is needed is a read-assist circuit that exhibits improved temperature tracking capabilities independent of process while avoiding the SRAM and periphery alignment constraints.

SUMMARY OF THE INVENTION

The present invention is directed to a read-assist circuit that enhances the performance of SRAM arrays embedded in host IC devices by way of exclusively utilizing PMOS transistors (i.e., no NMOS transistors are used) to provide highly robust temperature-compensated wordline lowering that is process independent and obviates the need for tuning after fabrication. That is, implementing the read-assist circuit using PMOS transistors makes word line lowering almost independent of SRAM and periphery process corners, whereby the amount of word line lowering totally depends on temperature. In one embodiment, temperature-compensated wordline lowering is generated on each wordline of an SRAM array by way of a read-assist PMOS transistor controlled by an associated temperature compensation circuit, where the temperature compensation circuit includes a first pull-up PMOS transistor having a source terminal connected to a high system voltage source and gate and drain terminals connected to a gate terminal of the read-assist PMOS transistor, and a pull-down PMOS transistor having a source terminal connected to a low system voltage source and gate and drain terminals connected to the read-assist PMOS transistor. In a preferred embodiment, the pull-up PMOS transistor and the pull-down PMOS transistor are fabricated using known techniques such that the pull-down PMOS transistor has a higher drive strength and a lower threshold voltage than those of the pull-up transistor, whereby the temperature compensation circuit generates a temperature-compensation signal on the gate terminal of the read-assist PMOS transistor with a voltage level that varies in a manner that is inversely proportional to the operating temperature of the SRAM array. For example, at lowermost SRAM operating temperatures (e.g., −40° C.), the temperature-compensation signal is substantially greater (more positive) than the low system voltage source, whereby the read-assist transistor is substantially turned off, whereby the wordline underdrive voltage is minimized (i.e., the activated wordline has a voltage level close to the high system voltage source). Conversely, at higher SRAM operating temperatures (e.g., 120° C.), the temperature-compensation signal is only slightly more positive than the low system voltage source, whereby the read-assist transistor is substantially turned on to generate a maximum wordline underdrive voltage (i.e., the activated wordline is substantially lower than the high system voltage source). By configuring the read-assist transistor and the temperature compensation circuit using only PMOS transistors, the read-assist circuit of the present invention provides robust and consistent wordline lowering that is process independent and avoids the need for tuning after fabrication. In addition, by exclusively utilizing PMOS transistors in this configuration, the read-assist circuit generates temperature-compensated wordline lowering that is independent of process mismatch across SRAM and periphery logic corners that solely depends on operation temperature, thereby ensuring robustness of the novel read assist scheme against process variation. Temperature tracking effectively reduces word-line on duration at low and nominal temperature range. Smaller word-line duration decreased read and write dynamic power of memory at low and nominal temperature.

According to a presently preferred embodiment, read-assist circuits configured in accordance with the present invention are implemented in high density (HD) or high current (HC) SRAM arrays in which the SRAM bitcells comprise six-transistor (6T) single-fin FinFET memory cells that are formed by circuit elements fabricated on a substrate in accordance with a suitable (e.g., 7 nm or other nanometer-scale) CMOS FinFET fabrication process. Each 6T SRAM bitcell includes a pair of cross-coupled inverters configured to store a data bit (i.e., a logic "1" or "0") and a pair of NMOS pass gates that are controlled by an associated wordline, whereby the cross-coupled inverters are accessed by a pair of complementary bitlines during read and write operations by way of increasing the associated wordline's voltage level to turn on the NMOS pass gates. When implemented in a presently preferred embodiment using a 7 nm CMOS fabrication process and a nominal operating voltage of 750 mV, the read-assist circuit of the present invention generates approximately 40 mV of wordline lowering to achieve minimum operating voltages (Vmin) as low as 0.5V while increasing bitcell stability from 4 sigmas to 6 sigmas over conventional approaches and ensuring 99% yield for a 256 Megabyte SRAM array. In addition, the read-assist circuit configuration is implemented with an area overhead of only two percent, which represents a substantial improvement over conventional solutions. Further, the PMOS-based read-assist approach of the present invention avoids the performance loss associated with conventional wordline lowering techniques by generating improved read current values of up to approximately three times those generated by conventional approaches, which results in an access time improvement of more than 150%, and improved operating frequency of up to 100% for low voltage range operations.

According to a presently preferred embodiment of the present invention, the read-assist circuit utilizes actuation circuits to decouple the temperature compensation circuits during non-active read/write cycles in order to minimize power consumption by the SRAM array. That is, a sum of the small leakage currents through the temperature compensation circuits could produce a significant undesirable battery drain in portable devices if the temperature compensation circuits were allowed to generate the temperature compensation signal during non-active cycles. In one embodiment, the actuation circuits are configured to control associated temperature compensation circuits in response to a pre-decoder signal generated by an address decoder circuit of the SRAM array, and read-assist clock signal generated by a clock generator circuit of the SRAM array. In a specific embodiment, the actuation circuit includes a second pull-up PMOS transistor that is connected between high system voltage source and the gate/drain terminals of the first pull-up PMOS transistor and is controlled by the read-assist clock signal, and a logic gate (e.g., a NAND gate) that generates a read-assist enable signal in response to the pre-decoder signal and the read-assist clock signal. With this configuration, during active read and write operations, the decoder select signal and the read-assist clock signal are toggled to high voltage levels (e.g., at the high system voltage source), which turns off the second pull-up PMOS transistor and causes the logic gate to generate the read-assist enable signal at the low system voltage source level, whereby the associated temperature compensation circuit controls the read-assist PMOS transistor to generate temperature compensated wordline lowering in the manner described above. Conversely, when any of the decoder select signal and the read-assist clock signal are logic low, the first pull-up PMOS transistor is turned on such that the high system voltage source is passed to the gate terminal of the read-assist PMOS transistor, and the logic gate de-asserts the read-assist enable signal (i.e., applies the high system voltage source to the gate terminal of the pull-down PMOS transistor), whereby the PMOS transistors forming the associated temperature compensation circuit are fully turned off to prevent leakage during the non-active cycles. By including actuation circuits that are configured to function as described above, the read-assist circuit of the present invention is optimized for portable device applications by way of preventing current drain during non-active periods.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved read-assist circuit for High Density 6T FinFET SRAM arrays. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
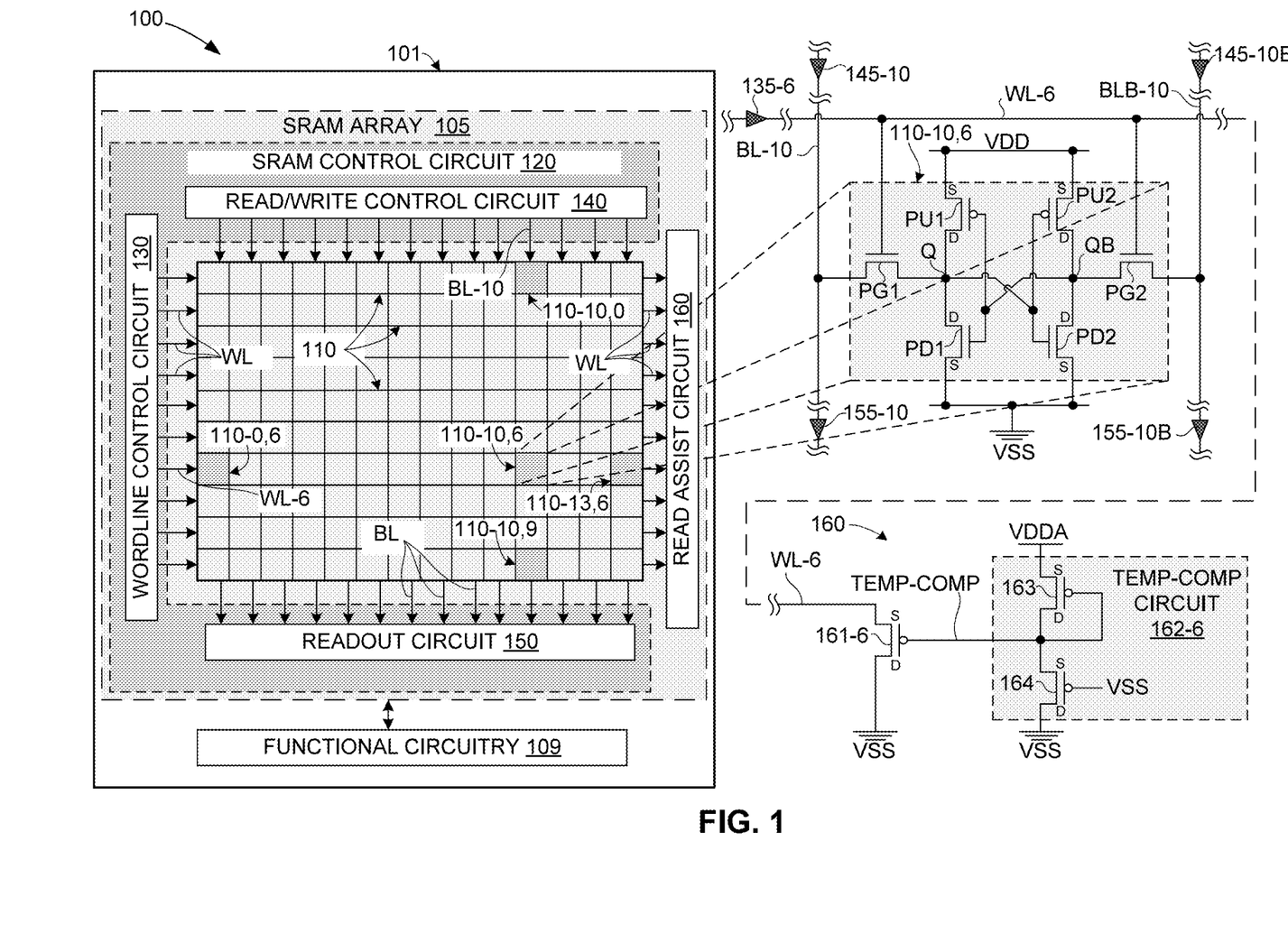
FIG. 1 is a block/circuit diagram showing a simplified IC circuit including an SRAM array having a temperature compensated read-assist circuit according to an embodiment of the present invention.

FIG. 1 is a two-part figure in which a generalized and greatly simplified integrated circuit (IC) device 100 is shown in block-diagram form in the left side portion of the figure, and both a single static random-access memory (SRAM) bitcell and a portion of a read-assist circuit 160 of IC device 100 are depicted in schematic form in the right side of FIG. 1.

Referring to the left side of FIG. 1, IC device 100 includes an SRAM array 105 and optional functional circuitry 109 that are fabricated on a semiconductor substrate 101 (e.g., a silicon wafer) using a selected CMOS fabrication process (node). In a presently preferred embodiment, SRAM array 105 is characterized by way of read-assist circuit 160, which is configured as set forth below, in combination with either a high density (HD) and high current (HC) SRAM circuit structure including six-transistor (6T) single-fin FinFET SRAM bitcells 110 that are arranged in horizontal rows and vertical columns, and are fabricated in and/or on semiconductor substrate 101 using a nanometer-scale (e.g., 7 nm) CMOS FinFET process node. Functional circuitry 109 and additional circuitry (e.g., input/output circuitry, not shown) of IC device 100 are also fabricated on substrate 101 using the same FinFET CMOS process node utilized to fabricate SRAM array 105. Functional circuitry 109 is operably coupled to and configured to interact with SRAM array 105 (i.e., write data to and/or read data from) using known techniques, and configured to perform any of a wide range of logic functions involving the data. Accordingly, the present invention is primarily directed to SRAM arrays that include the novel features set forth below, but is also intended to cover any IC device 100 that utilizes SRAM cells including the novel features set forth below.

SRAM array 105 is depicted in a greatly simplified form in FIG. 1 for clarity and brevity. The multiple horizontally aligned rows and vertically aligned columns of SRAM bitcells 110 are accessed during operation by a SRAM control circuit 120, which generally includes a wordline control circuit 130, a read/write control circuit 140, and a readout circuit 150. Each row of SRAM bitcells 110 is accessed during read or write operations by wordline signals generated by wordline control circuit 130 and transmitted along an associated wordline WL. For example, each SRAM bitcell included in the horizontally aligned row containing SRAM bitcells 110-0,6 to 110-13,6 is operably coupled to an associated wordline WL-6, whereby each SRAM bitcell 110-0,6 to 110-13,6 is simultaneously accessed during read and write operations by way of a positive voltage signal generated on wordline WL-6. Each vertically aligned column of SRAM bitcells 110 in array 105 is coupled to at least one bitline BL whose voltage level is controlled by read/write control circuit 140 during read and write operations in the manner described below, and whose voltage level is detected by readout circuit 150 during read operations in the manner described below. For example, each SRAM bitcell included in the column containing SRAM bitcells 110-10,0 to 110-10,9 is operably coupled to associated bitline BL-10, whereby each SRAM bitcell 110-10,0 to 110-10,9 is sequentially accessed during read operations to store data values transmitted on bitline BL-10 from read/write control circuit 140, and is sequentially accessed during write operations to transmit stored data values onto bitline BL-10 for detection by readout circuit 150. SRAM array 105 is depicted with one-hundred and forty SRAM bitcells 110 arranged in ten rows and fourteen columns to simplify the following description; that is, practical SRAM arrays typically include a substantially larger number of SRAM bitcells 110. In addition, other required circuitry known in the art as being required for operation of SRAM cell 105 is omitted for brevity.

Referring to the upper right side of FIG. 1, an exemplary 6T SRAM bitcell 110-10,6 is depicted in transistor level schematic form, along with an associated wordline WL-6, complementary bitlines BL-10 and BLB-10, and additional simplified circuitry associated with the generation and detection of signals of the wordline and bitlines during read and write operations. 6T SRAM bitcell 110-10,6 generally includes a pair of cross-coupled inverters that are configured to provide a storage element capable of storing a single bit of data. The first inverter is formed by an N-type pull-down transistor PD1 and a P-type pull-up transistor PU1, and the second inverter is formed by an N-type pull-down transistor PD2 and a P-type pull-up transistor PU2. The first inverter forms a true intermediate storage node Q that is connected to the gate terminals of transistors PD2 and PU2. The second inverter forms an inverted intermediate storage node QB that is connected to the gate terminals transistors PD1 and PU1. SRAM bitcell 110-10,6 also includes N-type pass gates PG1 and PG2, which are controlled by a wordline signal transmitted onto wordline WL-6 by an associated driver 135-6 of wordline control circuit 130 using known techniques, and are configured to serve as access devices to provide a switchable data path for complementary data values transmitted between complementary bitlines BL10 and BLB-10 and intermediate storage nodes Q and QB during read and write operations. The source terminals of the pull-up transistors PU1 and PU2 are connected to the high system voltage source VDD, and the source terminals of the pull-down transistors PD1 and PD2 are connected to the low system voltage VSS (i.e., ground). Drain terminals of the pull-up transistor PU1 and pull-down transistor PD1 are connected together at first intermediate storage node Q1, and pass gate PG1 is connected between true intermediate storage node Q and bit line BL-10. Drain terminals of pull-up transistor PU2 and pull-down transistor PD2 are connected together at inverted intermediate storage node QB, and pass gate PG2 is connected between inverted intermediate storage node QB and complementary bit line BLB-10.

Exemplary write and read operations performed using SRAM array 105 will now be described with reference to an arbitrary data value written to and read from exemplary SRAM bitcell 110-10,6.

A data value is written to and stored on a selected SRAM bitcell during a corresponding write operation by way of applying voltage levels corresponding to the data value onto the associated complementary bitlines, and then turning on the bitcell's pass gates to pass the bitline voltages to the bitcell's storage element. Specifically, read/write control circuit 140 actuates bitline drivers 145-1 and 145-1B to generate complementary voltage levels corresponding to the data bit's value on bitline BL-10 and complementary bitline BLB-10, respectively (e.g., a logic "1" data bit value is produced by applying a high/VDD voltage on bitline BL-10 and a low/VSS voltage on complementary bitline BLB-10, and a logic "0" data bit value is produced by applying a low/VSS voltage on bitline BL-10 and a high/VDD voltage on complementary bitline BLB-10. Subsequently, wordline control circuit 130 causes a wordline driver 135-6 to assert wordline WL-6 (i.e., by decoupling wordline WL-6 from low voltage supply VSS and coupling wordline WL-6 to high voltage supply VDD), thereby turning on NMOS pass gates PG1 and PG2 and opening a path between intermediate storage nodes Q and QB and associated bitlines BL-10 and BLB-10, whereby the storage element is biased by the complementary bitline voltage levels representing the data bit value. Wordline control circuit 130 then de-actuates wordline driver 135-6 to turn off pass gates PG1 and PG2, thereby isolating intermediate storage nodes Q and QB from bitlines BL-10 and BLB-10. In the isolated state, the high (or low) voltage level written to intermediate node Q causes the inverter formed by pull-up transistor PU2 and pull-down transistor PD2 to maintain the low (or high) voltage level that was written to inverted intermediate node QB, and the low (or high) voltage level on inverted intermediate node QB causes the first inverter formed by pull-up transistor PU1 and pull-down transistor PD1 to maintain the high (or low) voltage level on inverted intermediate node QB. SRAM bitcell 110-10,6 is thus able to store (maintain) the "1" or "0" bit value without the need for the periodic refresh required by dynamic RAM memories.

The data value stored on a selected SRAM bitcell may be read during a corresponding read by accessing the bitcell's storage element in a manner similar to that used during the write operation, and then determining the complementary voltage levels generated on the associated bitlines. In one embodiment, at the beginning of a subsequent read operation utilized to read the data bit value stored on SRAM bitcell 110-10,6, read/write control circuit 140 actuates bitline drivers 145-1 and 145-1B to precharge bitlines BL-10 and BLB-10 with complementary charges (i.e., by briefly applying high supply voltage VDD onto bitline BL-10 and bitline BLB-10). Wordline control circuit 130 then asserts wordline WL-6 using wordline driver 135-6 to turn on NMOS pass gates PG1 and PG2, thereby generating a first signal path between bitline BL-10 and intermediate node Q and a second signal path between inverted bitline BLB-10 and intermediate node QB. Depending on the precharge levels on bitlines BL-10 and BLB-10 and the voltage levels stored on intermediate nodes Q and QB, the precharge levels are either maintained or inverted by SRAM bitcell 110-10,6, and the final differential bitline voltage levels are detected by readout circuit 150 (e.g., by way of sense amplifiers 155-10 and 155-10B) to determine the stored data value.

Referring again to SRAM array 105 (FIG. 1), read-assist circuit 160 is coupled to the rightmost ends of wordlines WL. According to an aspect of the present invention, read-assist circuit 160 is configured to enhance the performance of SRAM array 105 by way of exclusively utilizing PMOS transistors (i.e., no NMOS transistors are used) to provide highly robust temperature-compensated wordline lowering on all wordlines WL during active read operation cycles that is process independent and obviates the need for tuning after fabrication. An exemplary embodiment of the novel PMOS-based configuration is described below with reference to a portion of read-assist circuit 160 that is utilized to apply temperature-compensated wordline lowering on a single wordline WL-6, whereby the suffix "-6" is utilized to indicate elements of the associated read-assist circuit portion. It is understood that read-assist circuit 160 includes multiple identical read-assist circuit portions, each portion being operably configured to apply temperature-compensated wordline lowering on a different associated wordline WL of SRAM array 105.

Referring to the lower right portion of FIG. 1, the portion of read-assist circuit 160 utilized to apply temperature-compensated wordline lowering on wordline WL-6 includes a read-assist PMOS transistor 161-6 and a temperature-compensation circuit 162-6. Read-assist PMOS transistor 161-6 is connected between wordline WL-6 and (first) low system voltage source VSS (ground). Temperature-compensation circuit 162-6 (which is a preferred embodiment is shared across multiple wordline drivers) includes a (first) pull-up PMOS transistor 163 and a pull-down PMOS transistor 164 that are connected in series between a (second) high system voltage source VDDA (which in one embodiment is identical to SRAM supply voltage VDD) and VSS. Pull-up PMOS transistor 163 has a source terminal connected to VDDA, and has a gate terminal and a drain terminal connected together and to a gate terminal of read-assist PMOS transistor 161-6. Pull-down PMOS transistor 164 has a drain terminal connected to the gate terminal of read-assist PMOS transistor 161-6, a source terminal connected to VSS, and a gate terminal that is coupled to VSS (e.g., by way of an actuation circuit, described below). In one embodiment, read-assist PMOS transistor 161-6, pull-up PMOS transistor 163 and pull-down PMOS transistor 164 are configured and fabricated using known techniques such that pull-up PMOS transistor 163 is relatively much weaker in drive strength in comparison to pull-down PMOS transistor 164, and a threshold voltage of pull-down PMOS transistor 164 is lower than the threshold voltage of pull-up PMOS transistor 163. Effectively transistor 164 pull-down PMOS transistor 164 is better than pull-up PMOS transistor 163 transistors in both size and threshold voltage. In addition, read-assist PMOS transistor 161-6 is configured to be the same as the pull-up PMOS transistor utilized by word line driver 135-6 to pull-up wordline WL-6 to VDD (e.g., see PMOS 135-6A in FIG. 2A, discussed below), and the size of 161-6 transistor is varied with value of word line lowering required, which varies with technology and voltage support. Note that pull-up PMOS transistors PU-1 and PU-2 of each 6T FinFET memory cell 110 typically differ from PMOS transistor (e.g., PMOS transistors 163, 164 and 161-6) of the SRAM periphery circuitry. With this configuration, temperature compensation circuit generates a temperature-compensation signal TEMP-COMP on the gate terminal of read-assist PMOS transistor 161-6 in accordance with temperature related changes in the gate over-drive voltage of pull-down PMOS transistor 164, whereby temperature-compensation signal TEMP-COMP is produced with a voltage level that is inversely proportional to the operating temperature of SRAM array. For example, at low SRAM operating temperatures (e.g., −40° C.), the gate drive of amount of pull-down PMOS transistor 164 is relatively low, whereby temperature-compensation signal TEMP-COMP is generated at a voltage level that is substantially greater (more positive) than the low system voltage source VSS. The relatively high voltage level of temperature-compensation signal TEMP-COMP causes read-assist transistor 161-6 to substantially turned off, thereby producing a minimal wordline underdrive voltage WLUD on wordline WL-6 (i.e., asserted wordline WL-6 maintains a voltage level close to the VDDA), which provides the desired higher wordline voltage level during read operations performed at low operating temperatures. Conversely, at higher SRAM operating temperatures (e.g., 120° C.), the gate drive of pull-down PMOS transistor 164 is larger/stronger, whereby temperature-compensation signal TEMP-COMP is generated at a voltage level that is only slightly more positive than VSS, which substantially fully turns on read-assist transistor 161-6 to generate a maximum wordline underdrive voltage WLUD (i.e., asserted wordline WL-6 is substantially lower than VDDA), thereby providing the desired lower wordline voltage level during read operations performed at high operating temperatures. When SRAM array 105 is implemented using a 7 nm CMOS fabrication process and a nominal operating voltage of 750 mV, read-assist circuit 160 generates approximately 40 mV of wordline lowering to achieve minimum operating voltages (Vmin) as low as 0.5V while increasing bitcell stability from four sigmas to six sigmas over conventional approaches and ensuring 99% yield for a 256 Megabyte SRAM array.

Although generalized read-assist circuit 160 (FIG. 1) achieves beneficial wordline lowering while occupying minimal chip area, which may be desirable in some SRAM arrays, read-assist circuit may be modified to include additional circuitry without departing from the spirit and scope of the present invention. For example, each temperature compensation circuit (e.g., temperature compensation circuit 162-6, shown in FIG. 1) creates a small short-circuit path during both active read operation cycles and non-active cycles, whereby the sum of the resulting leakage currents during non-active cycles can create an undesirable and unnecessary power drain that may make SRAM array 105 undesirable in portable device applications.

Figure 2A:
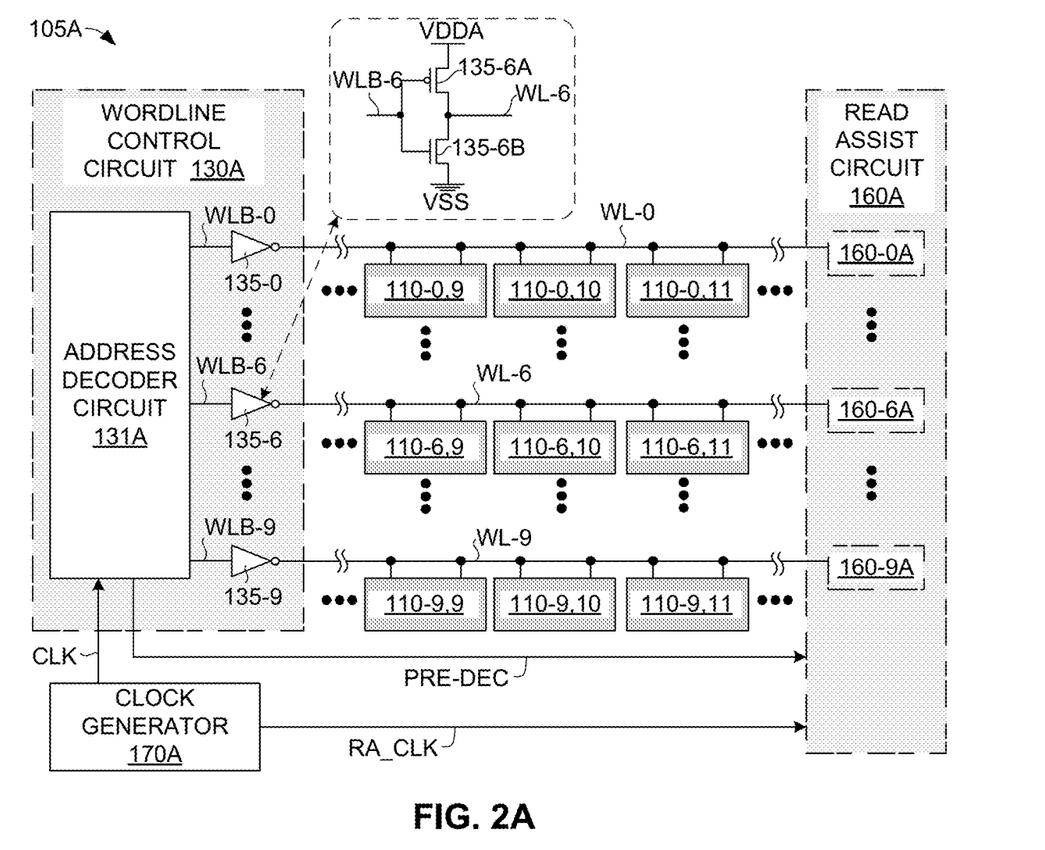
FIG. 2A is a block diagram showing a simplified SRAM array including a temperature compensated read-assist circuit according to another embodiment of the present invention.
Figure 2B:
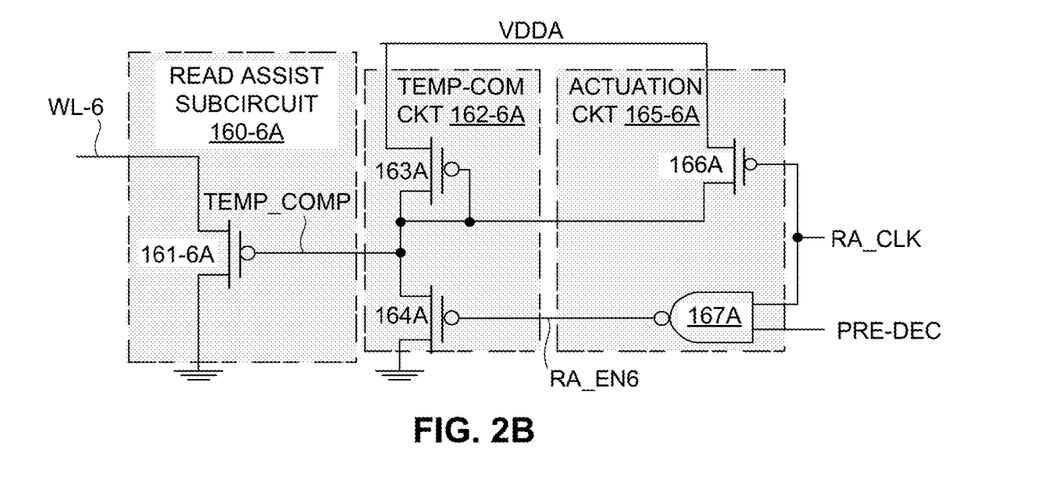
FIG. 2B is a circuit diagram depicting a portion of the temperature compensated read-assist circuit included in the SRAM array of FIG. 2A.

FIGS. 2A and 2B depict an SRAM array 105A according to a second embodiment of the present invention in which a read-assist circuit 160A implements the temperature compensated wordline lowering operation described above with reference to FIG. 1, and further includes actuation circuits configured to apply a voltage close to low voltage supply VSS to the gate terminals of associated read-assist PMOS transistors and pull-down PMOS transistors when corresponding wordlines are asserted (i.e., during active read operation cycles when corresponding wordline voltages are increased/high), and configured to apply the high voltage source VDDA to the gate terminals of the associated read-assist PMOS transistors and pull-down PMOS transistors during non-active read operation cycles (i.e., when the wordlines are de-asserted).

FIG. 2A is a simplified block diagram showing portions of SRAM array 105A that are related to the operation of modified read-assist circuit 160A. SRAM array 105A includes 6T SRAM bitcells configured and arranged in rows and columns in the manner described above with reference to FIG. 1, a wordline control circuit 130A configured to assert wordlines WL-0 to WL-9 during read and write operations in the manner described above with reference to FIG. 1, and modified read-assist circuit 160A. Note that modified read-assist circuit 160A is depicted on the right side of FIG. 2A for illustrative purposes, and that in a presently preferred embodiment modified read-assist circuit 160A is physically located adjacent to the wordline drivers (i.e., inverting buffer circuits 135-0 to 135-9). Each row of SRAM bitcells is operably coupled to an associated wordline in the manner described above (e.g., with bitcells 110-0,9, 110-0,10 and 110-0,11 connected to wordline WL-0, bitcells 110-6,9, 110-6,10 and 110-6,11 connected to wordline WL-6, and bitcells 110-9,9, 110-9,10 and 110-9,11 connected to wordline WL-9). The wordlines are asserted/de-asserted by way of control signals WLB-0 through WLB-9, which are generated by an address decoder circuit 131A and applied to corresponding inverting buffer circuits 135-0 to 135-9 in accordance with a clock signal CLK generated by a clock generator circuit 170A using known techniques. Referring to the upper portion of FIG. 2B, each inverting buffer circuit (e.g., buffer circuit 135-6) includes a pull-up PMOS transistor 135-6A and a pull-down NMOS transistor 135-6B that are connected in series between VDDA and VSS, and are commonly controlled by inverted wordline control signal WLB-6 to generate the desired signal on wordline WL-6. Referring to the right side of FIG. 2A, read-assist circuit 160A includes multiple sub-circuits 160-0A to 160-9A, each of which being operably coupled to an associated wordline WL-0 to WL-9, respectively, and each sub-circuit 160-0A to 160-9A including the features of sub-circuit 160-6A, which is described below with reference to FIG. 2A. Additional features and operations of SRAM array 105A pertaining to read and write operations are understood to be similar to those described above with reference to FIG. 1, and are therefore omitted for brevity.

Figure 3A:
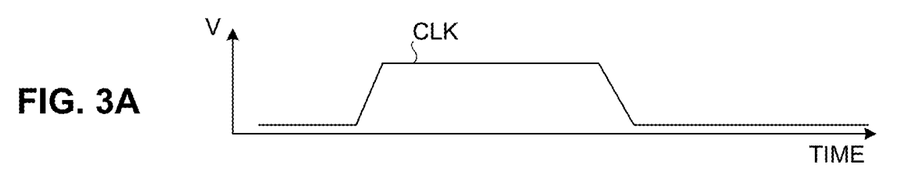
FIGS. 3A, 3B, 3C, 3D and 3E are timing diagrams depicting signal levels generated in the temperature compensated read-assist circuit of FIG. 2B during operation of the SRAM array of FIG. 2A.
Figure 3B:
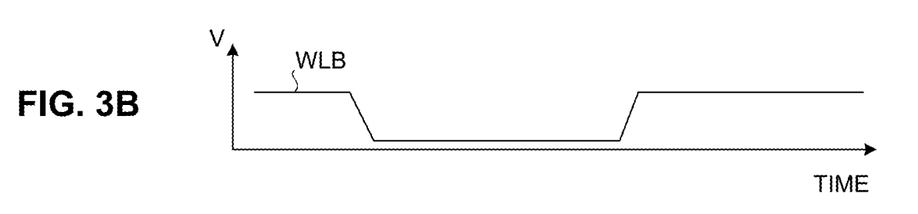
Figure 3C:
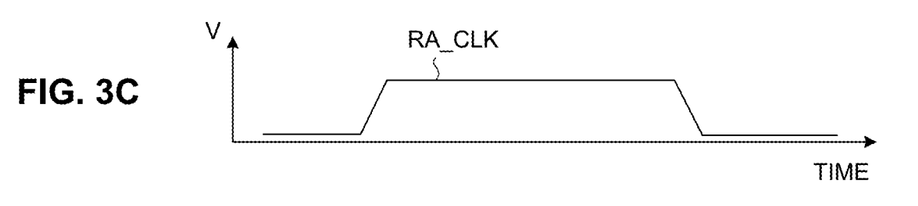
Figure 3D:
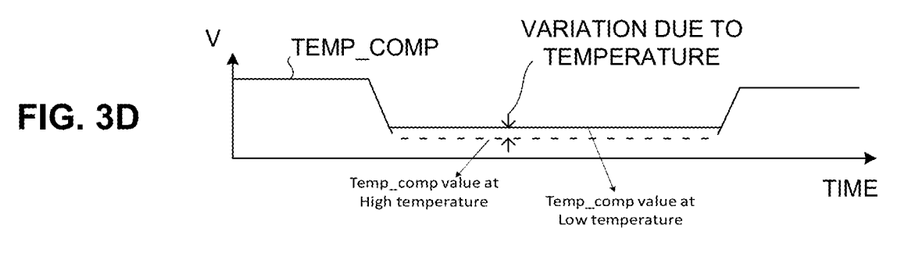
Figure 3E:
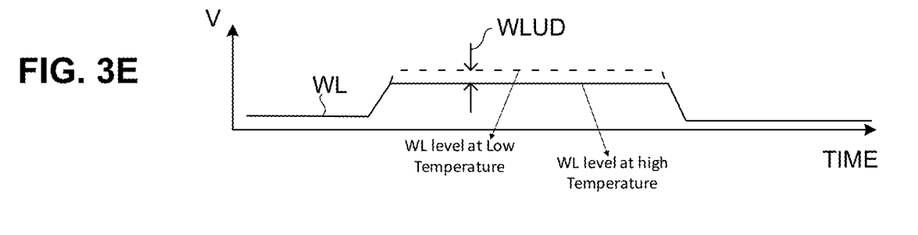

FIG. 2B shows read-assist sub-circuit 160-6A including a read-assist PMOS transistor 161-6A, and an associated temperature compensation circuit 162-6A and actuation circuit 165-6A that are configured to generate temperature-compensated wordline lowering on associated wordline WL-6 in the manner described above with reference to FIG. 1. Actuation circuit 165-6A includes a (second) pull-up PMOS transistor 166A and a NAND (logic) gate 167A that are operably configured to control associated temperature compensation circuit 162-6A in the manner described above. Specifically, pull-up PMOS transistor 166A is connected in parallel with pull-up PMOS transistor 163A between VDDA and the gate terminal of read-assist PMOS transistor 161-6A, and is operably controlled by way of a read-assist clock signal RA_CLK. NAND gate 167A includes input terminals coupled to receive read-assist clock signal RA_CLK and a pre-decoder signal PRE-DEC, and to apply a corresponding read-enable output signal RA-EN6 onto the gate terminal of pull-down PMOS transistor 164A of temperature compensation circuit 162-6A. FIGS. 3A to 3E depict relative voltage levels of clock signal CLK, wordline-assert-bar signal WLB-6, read-assist clock signal RA_CLK, temperature compensation signal TEMP-COMP, and wordline voltage level WL during an exemplary active read or write cycle associated with wordline WL-6. As indicated in FIG. 2A, in one embodiment pre-decoder signal PRE-DEC is generated by address decoder circuit 131A using known techniques such that pre-decoder signal PRE-DEC is asserted at the beginning of each active read/write operation cycle, and read-assist clock signal RA_CLK is generated by clock generator circuit 170A during active read/write operation cycles. In a preferred embodiment, each temperature compensation circuit 162-6A is configured and utilized to control multiple read-assist sub-circuits (e.g., eight) word lines of SRAM array 105, which reduces the chip area footprint required to implement the present invention. With this configuration, during active read/write operation cycles, decoder select signal PRE-DEC is asserted high and read-assist clock signal RA_CLK is generated in relation to clock signal CLK as indicated in FIGS. 3A and 3C, which turns off second pull-up PMOS transistor 166A and causes NAND gate 167A to generate read-assist enable signal RA_EN at low voltage source level VSS, whereby associated temperature compensation circuit 162-6A is enabled to control one or more associated read-assist PMOS transistor (e.g., transistor 161A) to generate temperature compensated wordline lowering on corresponding wordlines of array 105 (e.g., wordline WL-6) in the manner described above with reference to FIG. 1. As described above, the voltage level temperature compensation signal TEMP-COMP varies in accordance with the operating temperature of SRAM array 105A as indicated in FIG. 3D, whereby a wordline underdrive WLUD (i.e., amount of wordline lowering applied to wordline voltage WL) varies within a corresponding temperature dependent range as indicated in FIG. 3E. During non-active cycles, decoder select signal PRE-DEC and read-assist clock signal RA_CLK are de-asserted, whereby both first pull-up PMOS transistor 163A of temperature compensation circuit 162-6A and second pull-up PMOS transistor 166A of actuation circuit 165-6A are turned on such that high system voltage source VDDA is applied on the gate terminal of associated read-assist PMOS transistor 161-6A, and NAND gate 167A de-asserts read-assist enable signal RA_EN (i.e., applies the high system voltage source VDDA to the gate terminal of pull-down PMOS transistor 164A), whereby PMOS transistors 163A and 164A of associated temperature compensation circuit 162-6A are fully turned off to prevent short-circuit current during the non-active cycles. By controlling the temperature compensation circuits of read-assist circuit 160A using at least one actuation circuit configured to function as described above, read-assist circuit 160A prevents undesirable current drain during non-active periods. In addition, read-assist circuit 160A facilitates reducing the amount of time each wordline is asserted during each active cycle, thereby reducing the dynamic power consumption of SRAM array 105A at low and nominal operating temperatures in comparison to conventional read-assist approaches.

Figure 4:
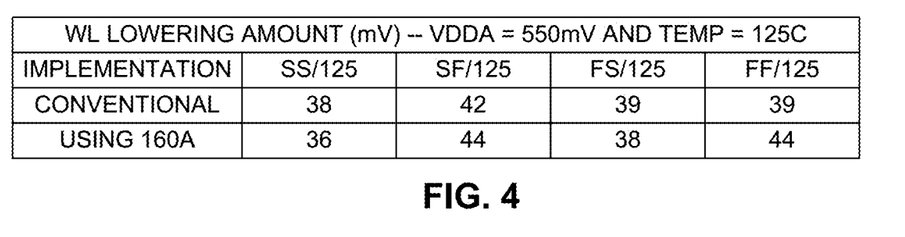
FIG. 4 is a table comparing experimentally generated performance data generated by conventional read-assist circuits and a temperature compensated read-assist circuit produced in accordance with the present invention.
Figure 5:
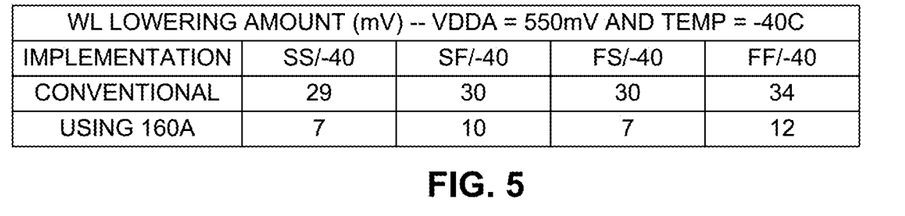
FIG. 5 is a table comparing additional experimentally generated performance data generated by conventional read-assist circuits and a temperature compensated read-assist circuit produced in accordance with the present invention.
Figure 6:
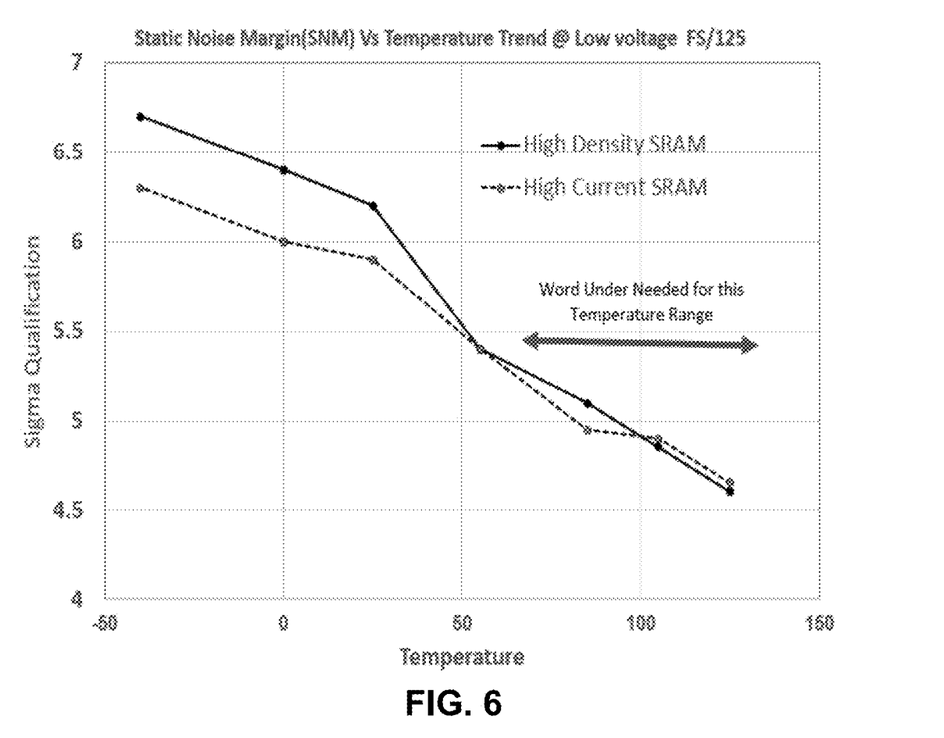
FIG. 6 is a graph depicting signal noise margin values exhibited by a temperature compensated read-assist circuit produced in accordance with the present invention as a function of temperature.
Figure 7:
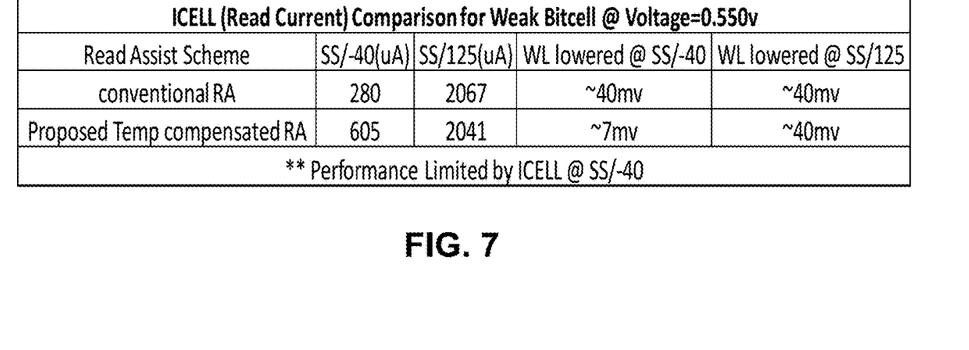
FIG. 7 is a table comparing experimentally generated read-current data generated by conventional read-assist circuits and a temperature compensated read-assist circuit produced in accordance with the present invention.

FIGS. 4 and 5 are tables showing comparisons between the conventional read-assist techniques described with reference to FIGS. 10A and 10B and those of the present invention at high and low operating temperatures, respectively. FIG. 4 indicates that both conventional techniques and the present invention facilitate wordline lowering on SNM impacted corners (e.g., fast/slow corners at a maximum operating temperature of 125° C. FIG. 5 indicates that, unlike the conventional technique, the present invention produces almost no wordline lowering at a minimum operating temperature of −40° C. on writability corners (e.g., slow/fast corners) and performance corners (e.g., slow/slow corners). FIG. 6 shows the variation of SNM for HD and High Current SRAMs for a range of temperatures between 125° C. and −40° C. Note that the operating speed for High Density SRAMs is limited by the operating speed of an applied read-assist circuit. By implementing the read-assist circuits of the present invention, read currents in HD SRAM speeds are greatly improved (i.e., by more than two times, as shown in FIG. 7). This gain in bitcell read current improves access and cycle time for SRAM arrays that incorporate read-assist circuits of the present invention.

Figure 8:
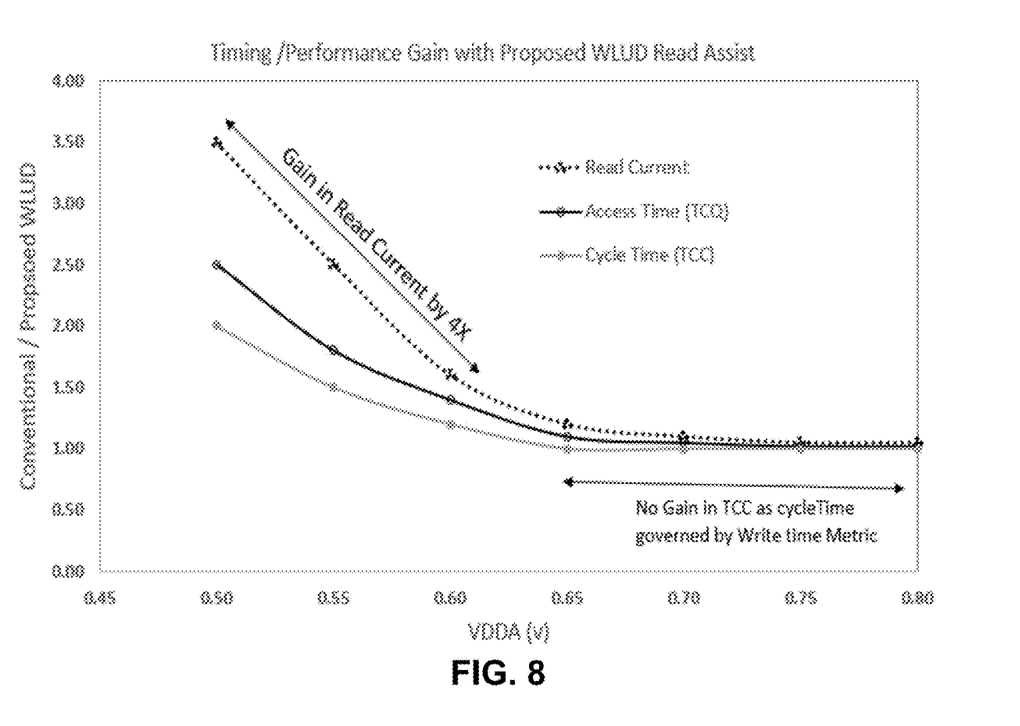
FIG. 8 is a graph showing a comparison of timing gains as a function of operating voltages exhibited by conventional wordline lowering circuits and a temperature compensated read-assist circuit produced in accordance with the present invention as a function of temperature.

In a conventional wordline lowering schemes, underdrive at SS/−40 C and SF/−40 C is almost comparable to what is designed for FS/125 C. This puts a performance penalty on memory speed. Considering similar degradation using conventional wordline lowering scheme, cell currents would have been reduced to one fourth, resulting into severe penalty on operating frequency and access time. This performance loss is recovered using the temperature compensated wordline lowering circuits of the present invention, as indicated by the improved read current values shown in FIG. 8. This improvement of read current (up to approximately three times that of the conventional approach) results in the improvement of the access time for SRAM by more than 150%. In addition to access time, operating frequency is also improved up to 100% for low voltage range operation, as reflected in FIG. 8.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A static random-access memory (SRAM) array comprising:
   a plurality of SRAM bitcells connected to a wordline; and
   a read-assist circuit comprising:
      a read-assist p-channel metal-oxide-semiconductor field effect (PMOS) transistor connected between said wordline and a first voltage source;
      a first pull-up PMOS transistor having a source terminal connected to a second voltage source, and having a gate terminal and a drain terminal connected to a gate terminal of the read-assist PMOS transistor; and
      a pull-down PMOS transistor having a drain terminal connected to the gate terminal of the read-assist PMOS transistor, having a source terminal connected to the first voltage source, and having a gate terminal coupled to the first voltage source.

2. The SRAM array of claim 1, wherein said first pull-up PMOS transistor and said pull-down PMOS transistor are operably configured such that a first drive strength of said pull-down PMOS transistor is greater than a second drive strength of said first pull-up PMOS transistor, and such that a first threshold voltage of said pull-down PMOS transistor is lower than a second threshold voltage of said first pull-up PMOS transistor.

3. The SRAM array of claim 2, wherein each said SRAM bitcell of the plurality of SRAM bitcells comprises a six-transistor (6T) FinFET memory cell including a first pass gate connected between a pair of cross-coupled inverters and an associated true bitline, and a second pass gate connected between the pair of cross-coupled inverters and an inverted bitline, said first and second pass gates having gate terminals connected to the wordline.

4. The SRAM array of claim 2, wherein the plurality of SRAM bitcells comprise circuit elements that are fabricated in accordance with a nanometer-scale CMOS FinFET fabrication process.

5. The SRAM array of claim 1, wherein the SRAM array includes a plurality of wordlines including said wordline, and wherein the read-assist circuit includes a plurality of sub-circuits, each said sub-circuit including a corresponding said read-assist PMOS transistor operably coupled to an associated wordline of said plurality of wordlines.

6. The SRAM array of claim 5, further comprising a corresponding temperature compensation circuit operably coupled to a gate terminal of said corresponding read-assist PMOS transistor of at least one of said sub-circuits.

7. The SRAM array of claim 1, wherein the read-assist circuit further comprises an actuation circuit configured to apply the first voltage source to the gate terminals of the read-assist PMOS transistor and the pull-down PMOS transistor when said wordline is asserted, and configured to apply the second voltage source to the gate terminals of the read-assist PMOS transistor and the pull-down PMOS transistor when said wordline is de-asserted.

8. The SRAM array of claim 7, wherein the actuation circuit comprises a second pull-up PMOS transistor connected in parallel to the first pull-up PMOS transistor and controlled by a read-assist clock signal, and a logic gate having input terminals coupled to receive said read-assist clock signal and a decoder select signal, wherein an output terminal of said logic gate is connected to the gate terminal of the pull-down PMOS transistor.

9. A static random-access memory (SRAM) array comprising:
   a plurality of six-transistor (6T) SRAM bitcells arranged in a plurality of rows and columns such that each said row of SRAM bitcells is connected to an associated wordline and each said column of said SRAM bitcells is connected to an associated pair of complementary bitlines; and
   a read-assist circuit comprising:
      a plurality of read-assist p-channel metal-oxide-semiconductor field effect (PMOS) transistors, each said read-assist PMOS transistor being connected between a corresponding said wordline and a first voltage source;
      a plurality of temperature compensation circuits, each said temperature compensation circuit configured to control an associated said read-assist PMOS transistor, and each said temperature compensation circuit including a first pull-up PMOS transistor and a pull-down PMOS transistor connected in series between the first voltage source and a second voltage source, wherein a drain terminal of the first pull-up PMOS transistor and a source terminal of the pull-down PMOS transistor are connected to a gate terminal of said associated read-assist PMOS transistor; and
      at least one actuation circuit configured to control an associated said temperature compensation circuit such that the first voltage source is applied to gate terminals of the read-assist PMOS transistor and the pull-down PMOS transistor of said associated said temperature compensation circuit when said associated wordline is asserted, and such that the second voltage source is applied to the gate terminals of the read-assist PMOS transistor and the pull-down PMOS transistor of said associated said temperature compensation circuit when said associated wordline is de-asserted.

10. An integrated circuit device including a static random-access memory (SRAM) array and functional circuitry integrally fabricated on a semiconductor substrate such that said functional circuitry is operably coupled to said SRAM array, wherein the SRAM array comprises:
- a plurality of wordlines;
- a plurality of six-transistor (6T) SRAM bitcells arranged in a plurality of rows such that each said row of SRAM bitcells is connected to an associated said wordline; and
- a read-assist circuit including a plurality of read-assist sub-circuits, each said read-assist sub-circuit being operably coupled to an associated wordline of said plurality of wordlines, and each said read-assist sub-circuit including:
  - a read-assist p-channel metal-oxide-semiconductor field effect (PMOS) transistor connected between said associated wordline and a first voltage source;
  - a first pull-up PMOS transistor having a source terminal connected to a second voltage source, and having a gate terminal and a drain terminal connected to a gate terminal of the read-assist PMOS transistor; and
  - a pull-down PMOS transistor having a drain terminal connected to the gate terminal of the read-assist PMOS transistor, having a source terminal connected to the first voltage source, and having a gate terminal coupled to the first voltage source.

11. The integrated circuit device of claim 10, further comprising at least one actuation circuit configured to control at least one of said read-assist sub-circuits such that the first voltage source is applied to gate terminals of the read-assist PMOS transistor and the pull-down PMOS transistor when said associated wordline is asserted, and such that the second voltage source is applied to the gate terminals of the read-assist PMOS transistor and the pull-down PMOS transistor when said associated wordline is de-asserted.

* * * * *